US012562660B2

(12) United States Patent
Shih et al.

(10) Patent No.:  US 12,562,660 B2
(45) Date of Patent:      Feb. 24, 2026

(54) ELECTRIC TOOL AND METHOD OF CONTROLLING ROTATIONAL SPEED OF THE SAME

(71) Applicant: BASSO INDUSTRY CORP., Taichung (TW)

(72) Inventors: Chun-Min Shih, Taichung (TW); Chong-Kun Hong, Taichung (TW)

(73) Assignee: BASSO INDUSTRY CORP., Taichung (TW)

( * ) Notice: Subject to any disclaimer, the term of this patent is extended or adjusted under 35 U.S.C. 154(b) by 203 days.

(21) Appl. No.: 18/319,726

(22) Filed: May 18, 2023

(65) Prior Publication Data

US 2023/0387837 A1     Nov. 30, 2023

(30) Foreign Application Priority Data

May 24, 2022    (TW) .................................. 111119320

(51) Int. Cl.
| | |
|---|---|
| *H02P 6/06* | (2006.01) |
| *B25F 5/00* | (2006.01) |
| *G01R 31/36* | (2020.01) |
| *G01R 31/3835* | (2019.01) |
| *H02P 6/08* | (2016.01) |

(52) U.S. Cl.
CPC ............... *H02P 6/08* (2013.01); *B25F 5/001* (2013.01); *G01R 31/3648* (2013.01); *G01R 31/3835* (2019.01); *H02P 6/06* (2013.01)

(58) Field of Classification Search
CPC .... H02P 6/08; H02P 6/06; H02P 23/14; H02P 23/0031; H02P 6/10; G01R 31/3835; G01R 31/3648; B25F 5/001

USPC ...................................................... 318/400.01
See application file for complete search history.

(56) References Cited

FOREIGN PATENT DOCUMENTS

| | | | |
|---|---|---|---|
| CN | 112443940 A | * | 3/2021 |
| EP | 3562030 A1 | | 10/2019 |

OTHER PUBLICATIONS

Chen et al. (EP 3562030 A1) Control System and Method for Power-Driven Nail Gun (Year: 2019).*
Yamamoto (CN 106160489 B) Control Method And Power Conversion Device Of Power Conversion Device (Year: 2018).*
Karlsson (WO 2017134484 A1).Method of Estimating an Operating Characteristic of a Power Converter (Year: 2017).*
Shelton et al. (CN 110785131 A) Surgical Instrument With The Joint Moving Speed Can Be Controlled (Year: 2020).*
Search Report issued to European counterpart application No. 23174877.3 by the EPO on Sep. 29, 2023.
"Regression analysis", Wikipedia, Oct. 15, 2019.

* cited by examiner

*Primary Examiner* — Jorge L Carrasquillo
(74) *Attorney, Agent, or Firm* — Burris Law, PLLC

(57) ABSTRACT

A method of controlling a rotational speed of an electric tool is provided. The electric tool includes a battery, a battery voltage detection circuit, a motor unit, and a controller. The controller stores at least one regression equation of duty ratio on voltage, and detects a voltage of the battery through the battery voltage detection circuit. The controller obtains a duty ratio for a control signal by substituting the voltage of the battery into the at least one regression equation, and outputs the control signal with the duty ratio obtained from the at least one regression equation to the motor unit for controlling operation of the motor unit.

7 Claims, 2 Drawing Sheets

ELECTRIC TOOL AND METHOD OF CONTROLLING ROTATIONAL SPEED OF THE SAME

CROSS-REFERENCE TO RELATED APPLICATION

This application claims priority to Taiwanese Invention Patent Application No. 111119320, filed on May 24, 2022.

FIELD

The disclosure relates to an electric tool and a method of controlling the same, and more particularly to an electric tool and a method of controlling a rotational speed of the same.

BACKGROUND

A motor speed of a conventional electric tool that operates in a no-load mode may change according to voltage of a battery (i.e., the motor speed is greater when the voltage is higher, and the motor speed is smaller when the voltage is lower). Since the voltage of the battery may decrease as time goes by, a conventional method for maintaining a constant motor speed (i.e., specifically, without an obvious drop) under different voltages is by using a look-up table, where the look-up table stores a plurality of duty ratios that respectively correspond to a plurality of voltage ranges.

A controller of the conventional electric tool may obtain one of the duty ratios that corresponds to the voltage of the battery from the look-up table, and output a control signal with the obtained duty ratio to the motor so as to maintain constant speed of the motor (or without an obvious drop).

However, smoothness of change in the motor speed may be highly affected by the voltage ranges used by the look-up table. That is to say, the smaller each of the voltage range is, the smoother the change in the motor speed and the greater the voltage range is, the more abrupt the change in the motor speed that will be. For example, assuming a predetermined motor speed to be 10000 revolution per minute (rpm), when the voltage of the battery is in a first range from to 15.50V, a first corresponding duty ratio is set to be 37.2%, and when the voltage of the battery is in a second range from 15.49V to 15.25V, a second corresponding duty ratio is set to be 37.6%. Under such setting, assuming that the voltage is currently at 15.74V, the duty ratio would be 37.2%, and the motor speed would be approximately 10000 rpm; when the voltage drops to 15.50V, the duty ratio would still be 37.2%, but the motor speed would drop to be smaller than 10000 rpm. When the voltage continues to drop, and drops to be smaller than 15.49V, the duty ratio would suddenly increase to 37.6%, thus suddenly bringing the motor speed back to 10000 rpm.

In this case, when the voltage shifts from one range to another (e.g., shifting from 15.50V to 15.49V as mentioned above), the motor speed would experience an abrupt change (e.g., a sudden increase), making the motor speed unstable.

SUMMARY

Therefore, an object of the disclosure is to provide a method of controlling a rotational speed of an electric tool that can alleviate at least one of the drawbacks of the prior art.

According to the disclosure, a method of controlling a rotational speed of an electric tool that includes a battery, a battery voltage detection circuit, a motor unit, and a controller is provided. The method includes steps of: the controller, which stores at least one regression equation of duty ratio on voltage, detecting a voltage of the battery through the battery voltage detection circuit; the controller obtaining a duty ratio for a control signal by substituting the voltage of the battery into the at least one regression equation; and the controller outputting the control signal with the duty ratio obtained from the at least one regression equation to the motor unit for controlling operation of the motor unit.

According to the disclosure, an electric tool that includes a battery, a battery voltage detection circuit, a motor unit, and a controller is provided. The battery voltage detection circuit is electrically connected to the battery and is configured to detect a voltage of the battery. The motor unit is configured to receive electric energy from the battery and operate according to a control signal. The controller is electrically connected to the battery voltage detection circuit and the motor unit, and stores at least one regression equation of duty ratio on voltage that respectively corresponds to at least one rotational-speed level. The controller is configured to obtain a duty ratio for the control signal by substituting the voltage of the battery detected by the battery voltage detection circuit into the at least one regression equation, and output the control signal with the duty ratio obtained from the at least one regression equation to the motor unit for controlling operation of the motor unit.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
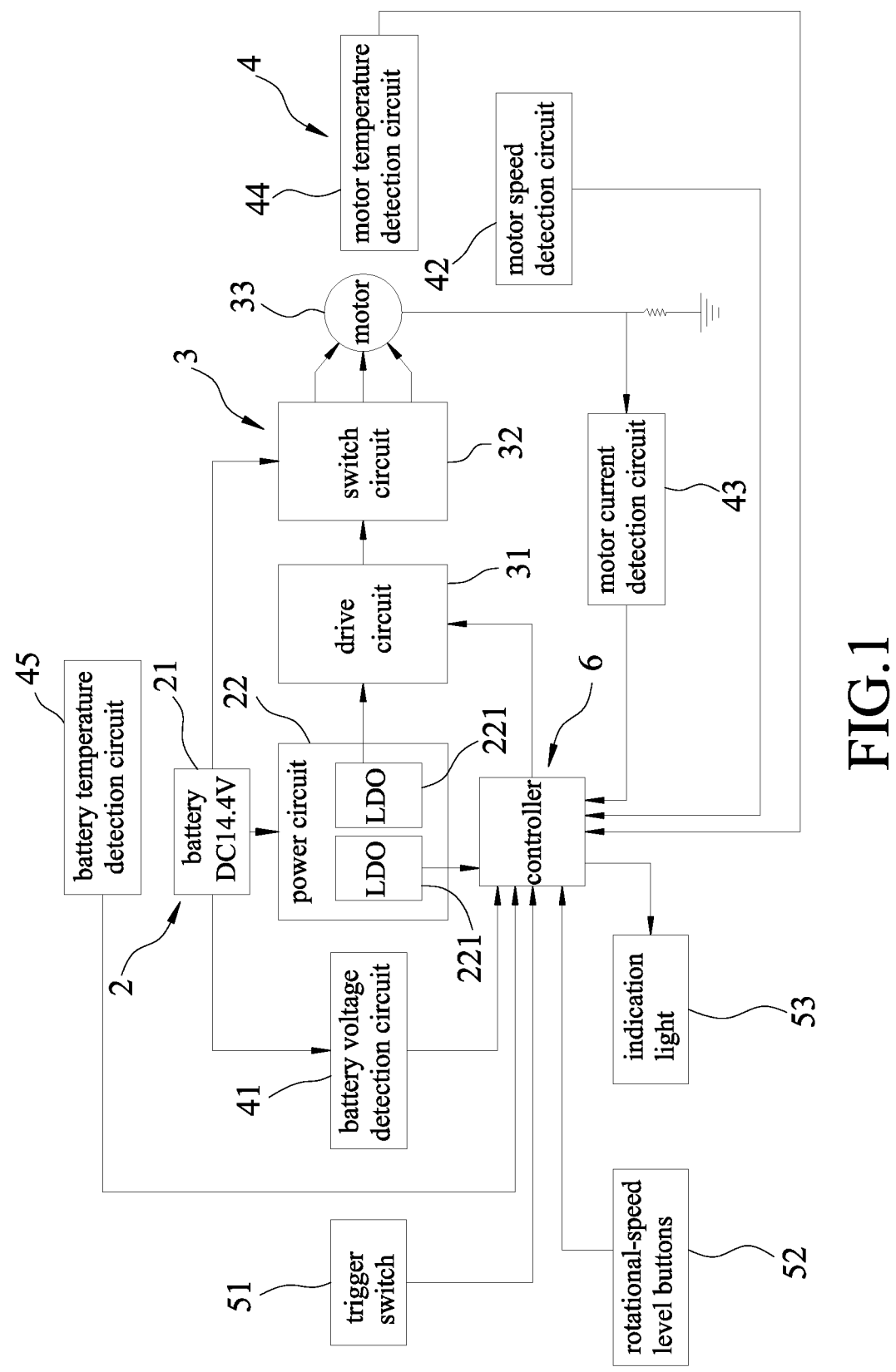
FIG. 1 is a block diagram illustrating a circuit of an electric tool according to an embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an electric tool according to an embodiment of the disclosure includes a power unit 2, a motor unit 3, a detection unit 4, a trigger switch 51, a plurality of rotational-speed level buttons 52, a plurality of indication lights 53, and a controller 6.

The power unit 2 includes a battery 21 and a power circuit 22. The power circuit 22 is configured to stabilize and transform an electric energy provided by the battery 21 (e.g., DC 14.4V) for use by other internal circuits of the electric tool, and may include, for example, two low-dropout regulators (LDOs) 221, each of which providing a different voltage.

The motor unit 3 includes a drive circuit 31, a switch circuit 32, and a motor 33. The drive circuit 31 is configured to receive electric power from the power circuit 22, receive a control signal outputted by the controller 6 in the form of a pulse-width modulation (PWM) signal, and control the switch circuit 32 to drive the motor 33 to rotate at a desired rotational speed based on a duty ratio of the PWM signal (i.e., the control signal). The switch circuit 33 may be implemented using a metal-oxide-semiconductor field-effect transistor (MOSFET) switch. The motor 33 may be implemented using a brushless direct current motor (BLDC).

The detection unit 4 includes a battery voltage detection circuit 41, a motor speed detection circuit 42, a motor current detection circuit 43, a motor temperature detection circuit 44, and a battery temperature detection circuit 45.

The battery voltage detection circuit 41 is electrically connected between the battery 21 and the controller 6, and is configured to detect a voltage of the battery 21 and output a battery voltage value (i.e., a magnitude of the voltage of the battery 21 thus detected) to the controller 6. The motor speed detection circuit 42 is configured to detect a rotor position of the motor 33 and output the rotor position to the controller 6, thus allowing the controller 6 to acquire a rotational speed of the motor 33. The motor speed detection circuit 42 may be implemented using a Hall sensor. The motor current detection circuit 43 is configured to detect a current of the motor 33 and output a motor current value (i.e., a magnitude of the current of the motor 33 thus detected) to the controller 6.

The motor temperature detection circuit 44 and the battery temperature detection circuit 45 are electrically connected to the controller 6 and are configured to detect temperatures of the motor 33 and the battery 21, respectively, thus allowing the controller 6 to monitor whether the temperatures are abnormal. Each of the motor temperature detection circuit 44 and the battery temperature detection circuit 45 may include a negative temperature coefficient (NTC) thermistor, and uses a resistor that is connected to the NTC thermistor in series to obtain a voltage division for detecting the temperature.

The trigger switch 51 is configured to, when pressed by a user, output a press signal to the controller 6. The rotational-speed level buttons 52 respectively correspond to different rotational-speed levels. Each of the rotational-speed level buttons 52 is configured to output a respective rotational-speed level signal to the controller 6 when pressed by the user. The rotational-speed level signal indicates one of the rotational-speed level that corresponds to the pressed rotational-speed level button 52. Upon receipt of the rotational-speed level signal, the controller 6 would set the rotational-speed level indicated by the rotational-speed level signal as an active rotational-speed level for the electric tool to operate at. The rotational-speed levels respectively correspond to different displaying manners of the indication lights 53, and the indication lights 53 are configured to light up by the controller 6 in one of the displaying manners that corresponds to the active rotational-speed level. In this embodiment, number of the indication lights 53 is identical to number of the rotational-speed level buttons 52, the indication lights 53 respectively correspond to the rotational-speed level buttons 52 which respectively correspond to the different rotational-speed levels, and the user may identify which one of the rotational-speed levels the electric tool is operating at by checking a displaying manner of the indication lights 53. The indication lights 53 may be implemented using light emitting diodes (LEDs).

The controller 6 is electrically connected to the motor unit 3 and stores at least one regression equation of duty ratio on voltage, where each of the regression equations may be a polynomial function, an exponential function, a logarithmic function, etc. The controller 6 is configured to detect the voltage of the battery 21 through the battery voltage detection circuit 41, obtain the duty ratio for the control signal by substituting the voltage of the battery 21 into the at least one regression equation, and output the control signal with the duty ratio thus obtained to the motor unit 3 for controlling operation of the motor unit 3.

In some embodiments, the controller 6 stores a plurality of regression equations respectively correspond to the rotational-speed levels, and the controller 6 substitutes the voltage into one of the regression equations that corresponds to the rotational-speed level as indicated by the rotational-speed level signal to obtain the duty ratio for the control signal.

The controller 6 may be implemented as a circuit with functions of analog-to-digital conversion (A/D conversion), input/output detection (I/O detection), rotational speed computation, and pulse-width modulation (PWM) output etc., such as a microcontroller unit (MCU).

The method of controlling the rotational speed of the motor of the electric tool according to an embodiment of the disclosure includes steps (A) to (E).

In step (A), the controller 6 stores at least one regression equation of duty ratio on voltage. In this embodiment, the electric tool includes four rotational-speed level buttons 52 that respectively correspond to four rotational-speed levels, and the controller 6 stores four regression equations respectively correspond to the four rotational-speed levels. The four rotational-speed levels respectively correspond to 10000, 15000, 20000, and 24500 revolutions per minute (rpm) for the rotational speed of the motor 33. In some embodiments, each of the regression equations may be obtained using a plurality of data sets that were created through measurements or estimations with respect to a rotational speed represented by the corresponding rotational-speed level. Each of the data sets may include a voltage value and a corresponding duty ratio value that made the electric tool operate at the rotational speed. Then, a computerized device may be used to perform a regression analysis on the data sets to obtain the regression equation. The regression analysis may be performed by finding a curve with a minimum sum of distances from each of the data sets. For example, the regression analysis is performed using a least square method. Since the regression analysis is well-known to one having ordinary skill in the art, it will not be described in further detail for the sake of brevity.

In step (B), the controller 6 detects the voltage of the battery 21 through the battery voltage detection circuit 41.

In step (C), the controller 6 substitutes the voltage of the battery 21 into one of the at least one regression equations to obtain the duty ratio for the control signal. In this embodiment, the controller 6 substitutes the voltage into one of the four regression equations that corresponds to the rotational-speed level as indicated in the rotational-speed level signal outputted by one of the rotational-speed level buttons 52 pressed by the user. For example, when the user presses one of the rotational-speed level buttons 52 that corresponds to 10000 rpm for the rotational speed of the motor 33, the controller 6 substitutes the voltage into one of the four regression equations that corresponds to the rotational-speed level of 10000 rpm to calculate the duty ratio for the control signal.

In step (D), the controller 6 outputs the control signal with the duty ratio obtained in step (C) to the motor unit 3 for controlling operation of the motor unit 3.

Figure 2:
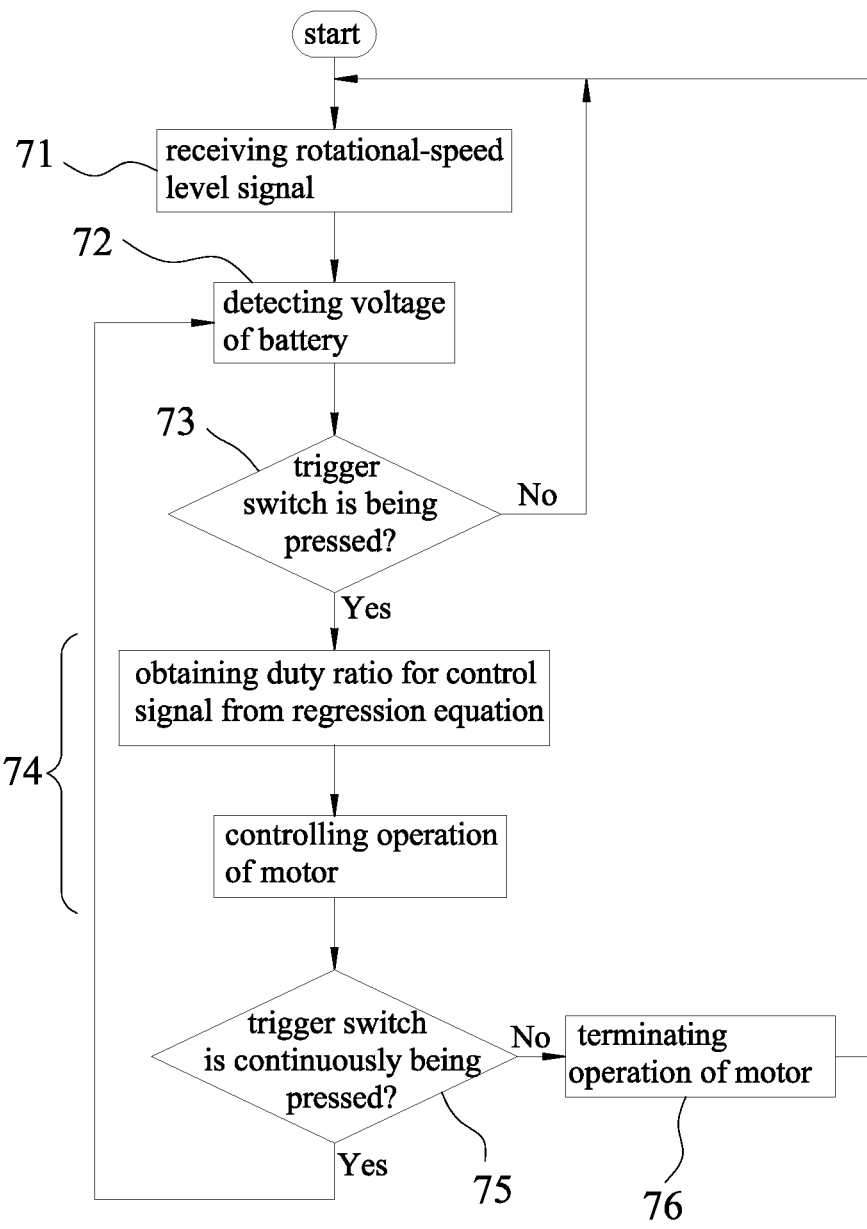
FIG. 2 is a flow chart illustrating a method of controlling a rotational speed of an electric tool according to an embodiment of the disclosure.

Further referring to FIG. 2, an example of an operation flow of the electric tool of this embodiment is provided.

In step 71, the controller 6 receives the rotational-speed level signal outputted by one of the rotational-speed level buttons 52 that is pressed by the user, and determines which one of the rotational-speed levels the rotational-speed level signal corresponds to.

In step 72, the controller 6 detects the voltage of the battery 21 through the battery voltage detection circuit 41.

In step 73, the controller 6 determines whether the trigger switch 51 is being pressed by determining whether the press signal is received from the trigger switch 51. When the trigger switch 51 is determined as being pressed, the flow proceeds to step 74; otherwise, the flow goes back to step 71.

In step 74, the controller 6 obtains the duty ratio for the control signal by substituting the voltage of the battery 21 into the at least one regression equation, and outputs the control signal with the duty ratio thus obtained to the motor unit 3 for controlling operation of the motor unit 3. The flow then proceeds to step 75.

In step 75, the controller 6 determines whether the trigger switch 51 is continuously being pressed by determining whether the press signal is continuously received from the trigger switch 51. If the trigger switch 51 is no longer being pressed, the flow proceeds to step 76; otherwise, the flow goes back to step 72.

Since the voltage of the battery 21 may decrease as time goes by, the voltage of the battery 21 needs to be continuously detected by performing step 72 in order to obtain the voltage of the battery 21 in real time.

In step 76, the controller 6 terminates the operation of the motor 3, and the flow goes back to step 71.

In summary, the controller 6 stores the at least one regression equation, substitutes the voltage of the battery 21 detected by the battery voltage detection circuit 41 into the at least one regression equation to obtain the duty ratio for the control signal, and outputs the control signal with the duty ratio thus obtained to the motor unit 3 for controlling operation of the motor unit 3. As such, when the voltage of the battery 21 gradually decreases over time, the controller 6 is able to output the control signal with increasingly greater duty ratios to offset the drop in the voltage, thus maintaining a stable rotational speed for the motor 33 without an abrupt increase of the rotational speed as compared to the conventional electric tool. In addition, having the plurality of regression equations respectively correspond to the different rotational-speed levels may optimize the performance of each of the rotational-speed levels in terms of maintaining stable rotational speed of the motor 33.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method of controlling a rotational speed of an electric tool that includes a battery, a battery voltage detection circuit, a motor unit, and a controller, the method comprising steps of:

the controller, which stores at least one regression equation of duty ratio on voltage, detecting a voltage of the battery through the battery voltage detection circuit;

the controller obtaining a duty ratio for a control signal by substituting the voltage of the battery into the at least one regression equation; and the controller outputting the control signal with the duty ratio obtained from the at least one regression equation to the motor unit to maintain a constant rotational speed of the motor unit, wherein the at least one regression equation includes a plurality of regression equations of duty ratio on voltage that respectively correspond to a plurality of rotational speed levels, wherein the step of the controller obtaining a duty ratio for a control signal includes the controller receiving a rotational-speed level signal that indicates one of the rotational-speed levels, and the controller substituting the voltage of the battery into one of the regression equations that corresponds to the one of the rotational-speed levels according to the rotational-speed level signal to obtain the duty ratio for the control signal, and wherein the electric tool includes a plurality of rotational-speed level buttons that respectively correspond to the rotational speed levels, and the one of the regression equations corresponds to one of the rotational speed levels as indicated in the rotational-speed level signal outputted by one of the rotational-speed level buttons being pressed.

2. The method as claimed in claim 1, wherein the step of the controller detecting the voltage of the battery through the battery voltage detection circuit is performed after the step of the controller receiving the rotational-speed level signal.

3. The method as claimed in claim 1, wherein the at least one regression equation of duty ratio on voltage is obtained by performing a regression analysis on a plurality of data sets, where each of the data sets includes a voltage value and a corresponding duty ratio value that made the electric tool operate at the constant rotational speed.

4. The method as claimed in claim 3, wherein the regression analysis is performed by finding a curve with a minimum sum of distances from each of the data sets.

5. The method as claimed in claim 3, wherein the regression analysis is performed using a least square method.

6. An electric tool comprising:

a battery;

a battery voltage detection circuit electrically connected to said battery and configured to detect a voltage of said battery;

a motor unit configured to receive electric energy from said battery and operate according to a control signal;

a plurality of rotational-speed level buttons, each configured to output a respective rotational-speed level signal to said controller when being pressed; and a controller electrically connected to said battery voltage detection circuit and said motor unit, said controller storing at least one regression equation of duty ratio on voltage and being configured to:

obtain a duty ratio for the control signal by substituting the voltage of said battery detected by said battery voltage detection circuit into the at least one regression equation, and output the control signal with the duty ratio obtained from the at least one regression equation to said motor unit to maintain a constant rotational speed of said motor unit, wherein the at least one regression equation includes a plurality of regression equations of duty ratio on voltage that respectively correspond to a plurality of rotational-speed levels, and wherein said rotational-speed level buttons respectively correspond to the rotational-speed levels, and said controller is further configured to receive a rotational-speed level signal that is outputted by one of said rotational-speed level buttons being pressed and that indicates one of the rotational-speed levels, and substitute the voltage of said battery into one of the regression equations that corresponds to the one of the rotational-speed levels according to the rotational-speed level signal to obtain the duty ratio for the control signal.

7. The electric tool as claimed in claim 6, wherein the at least one regression equation of duty ratio on voltage is obtained by performing a regression analysis on a plurality of data sets, where each of the data sets includes a voltage value and a corresponding duty ratio value that made the electric tool operate at the constant rotational speed.

* * * * *